(12) United States Patent
Creasy et al.

(10) Patent No.: US 7,663,888 B2
(45) Date of Patent: Feb. 16, 2010

(54) PRINTED CIRCUIT BOARD THICKNESS ADAPTORS

(75) Inventors: Simon Paul Creasy, Ottawa (CA); Paul James Brown, Wakefield (CA); Fabien Letourneau, Gatineau (CA)

(73) Assignee: Alcatel Lucent, Paris (FR)

( * ) Notice: Subject to any disclaimer, the term of this patent is extended or adjusted under 35 U.S.C. 154(b) by 248 days.

(21) Appl. No.: 11/487,506

(22) Filed: Jul. 17, 2006

(65) Prior Publication Data

US 2008/0013290 A1 Jan. 17, 2008

(51) Int. Cl.
*H05K 1/14* (2006.01)
(52) U.S. Cl. .................................. 361/737; 361/756
(58) Field of Classification Search ............... 361/756, 361/737, 727, 741, 686, 802; 439/377, 374
See application file for complete search history.

(56) References Cited

U.S. PATENT DOCUMENTS

| | | | | |
|---|---|---|---|---|
| 3,631,325 A | * | 12/1971 | Wenz | 361/705 |
| 3,992,653 A | * | 11/1976 | Richardson et al. | 361/707 |
| 4,914,552 A | * | 4/1990 | Kecmer | 361/801 |
| 5,224,016 A | * | 6/1993 | Weisman et al. | 361/728 |
| 5,276,590 A | * | 1/1994 | Budman et al. | 361/796 |
| 5,317,482 A | * | 5/1994 | Bujtas | 361/798 |
| 5,402,319 A | * | 3/1995 | Shumaker et al. | 361/796 |
| 5,500,789 A | * | 3/1996 | Miller et al. | 361/816 |
| 6,249,936 B1 | * | 6/2001 | Webster | 24/569 |
| 6,252,775 B1 | * | 6/2001 | Kuroda | 361/707 |
| 6,304,456 B1 | * | 10/2001 | Wortman | 361/796 |
| 6,735,093 B2 | * | 5/2004 | Mu-Tsai | 361/818 |
| 6,952,349 B2 | * | 10/2005 | Gough et al. | 361/741 |
| 2006/0156604 A1 | * | 7/2006 | Lawrence | 40/757 |

* cited by examiner

*Primary Examiner*—Hung S Bui
(74) *Attorney, Agent, or Firm*—Kramer & Amado, P.C.

(57) ABSTRACT

A printed circuit board card comprising: a printed circuit board having a first thickness and having first and second edges for inserting into respective channels of card guides, the channels of the card guides for receiving printed circuit boards having a second thickness, the second thickness being greater than the first thickness; and, first and second thickness adaptors each having a third thickness applied at the first and second edges, respectively, a sum of the first and third thicknesses approximating the second thickness, to thereby align the printed circuit board in the channels of the card guides.

16 Claims, 4 Drawing Sheets

PRINTED CIRCUIT BOARD THICKNESS ADAPTORS

FIELD OF THE INVENTION

This invention relates to the field of printed circuit boards, and more specifically, to adaptors for adjusting the thickness of printed circuit boards for installation in card guides.

BACKGROUND OF THE INVENTION

Complex telecommunications systems are often of a modular design. Such systems may have an enclosure housing a printed circuit board ("PCB") card cage or shelf having card slots with card guides into which a number of differently configured PCBs or PCB cards may be inserted. The card cage typically has a backplane (or midplane) with one or more multi-contact receptacle connectors into which one or more corresponding multi-contact plug connectors on the PCB may be inserted in a pluggable manner. The PCB may have a faceplate attached to an outer facing edge, the faceplate having tabs or handles for grasping to insert and remove the PCB from the card guides, slot, and cage. The faceplate is the part of the PCB assembly that can be seen when the PCB is inserted into a card cage. The faceplate may also function to secure the PCB or PCB card in the card guides or cage.

New generation PCBs for installation in existing (or new) systems are often thinner in design to reduce the aspect ratio of through-board vias, thereby increasing the reliability of the vias. The aspect ratio of a via is the ratio of the length of the via (for a through-board via, this length is the same as the board thickness) to its diameter. Reducing the diameter of vias increases the routability of a PCB. Routability refers to the ease with which traces can be routed through the PCB. Vias can create congestion in routing and larger diameter vias create more congestion which degrades routability. These problems can be offset by reducing the thickness of the PCB, for example, by reducing the number of layers comprising the board.

However, thin PCBs create several problems for existing (or new) systems that are configured for thick PCBs. One problem is that the thin PCBs may not fit securely (i.e., without play) into the card guides of such a system. This play in the fit of the PCB can cause bent connector pins on connectors of the backplane/midplane of the system due to misalignment when the PCB is being inserted into the system's card cage. Another problem is that sensors within the system may fail to detect the presence of a thin PCB plugged into the system if the thin PCB is not properly seated in card guides due to play in the fit of the thin PCB within the guides.

Adapting the card guides of such a system to accommodate thin PCBs is often not practical because any given card slot must be able to accept both the thin and thick PCBs. That is, there needs to be flexibility as to which slots are populated by which PCB types. Furthermore, modifying systems in the field in such a way as to accommodate thin PCBs is time-consuming and expensive.

The above problems are not unique to telecommunications systems. Redesigning PCBs and PCB cards for existing systems to reduce costs, add functionality, etc., is common in a variety of technical fields (e.g., data processing, manufacturing/industrial controls, etc.). Accordingly, several attempts have been made to address these problems. For example, U.S. Pat. No. 6,122,176 to Clements provides a mounting system for easier on-line replacement of odd-sized circuit cards in a card cage. This patent is directed to adapting odd-sized cards to be received in an electronic system. The patent describes a planar frame on which the subject circuit card is mounted. However, the patent does not address the problem of accommodating PCBs of various thicknesses. As another example, U.S. Pat. No. 6,191,950 to Cox, et al., provides a snap-together printed circuit card cover with an integral card support for use with Personal Computer Memory Card International Association ("PCMCIA") cards of various thicknesses. However, this patent would appear to be restricted to PCMCIA card applications. As another example, U.S. Pat. No. 6,967,850 to Barr, et al., provides a short card support for supporting a short printed circuit card insertable into an electronic system. The short card support has a card guide end adapted to couple to the card guide of the electronic system and a card receptor end adapted to couple with a first edge of the short printed circuit card. A support span between the card guide end and the card receptor end permits the short card support to accommodate varying lengths of short printed circuit cards. The card support is also adjustable for accommodating cards of varying thickness. And, as a final example, United States Patent Application Publication No. 2005/0124180 by Simonovich, et al., provides a removable card guidance block. The guidance block includes a base and a pair of opposing sides. A first set of opposing sides are attached to a top side of the base and provide a first separation configured to accept a first circuit card. A second set of opposing sides are attached to a bottom side of the base and provide a second separation configured to accept a second circuit card. However, these last two patents would appear to require modification to existing card guides or card cage components.

A need therefore exists for adaptors for adjusting the thickness of PCBs for installation in card guides. Accordingly, a solution that addresses, at least in part, the above and other shortcomings is desired.

SUMMARY OF THE INVENTION

According to one aspect of the invention, there is provided a printed circuit board card comprising: a printed circuit board having a first thickness and having first and second edges for inserting into respective channels of card guides, the channels of the card guides for receiving printed circuit boards having a second thickness, the second thickness being greater than the first thickness; and, first and second thickness adaptors each having a third thickness applied at the first and second edges, respectively, a sum of the first and third thicknesses approximating the second thickness, to thereby align the printed circuit board in the channels of the card guides.

With respect to the above printed circuit board card, the card guides may be components of a card cage. The printed circuit board may have a third edge for inserting into a backplane of the card cage. The printed circuit board may have a fourth edge for inserting into a channel on a rear surface of a faceplate, the channel for receiving printed circuit boards having the second thickness, and may further include at least one third thickness adaptor having the third thickness applied at the fourth edge to thereby align the printed circuit board in the channel of the faceplate. The faceplate may have means for securing the printed circuit board in at least one of the card guides and the card cage. The first and second adaptors may be formed from one of a shimming stock, a woven glass reinforced epoxy resin, a plastic, a metal, a leaf-spring, and a compressible material. The first and second adaptors may be elongate strips. The first and second adaptors may be secured to the printed circuit board by at least one of adhesives, mechanical fasteners, and soldering. The at least one third adaptor may be formed from one of a shimming stock, a woven glass reinforced epoxy resin, a plastic, a metal, a leaf-spring, and a compressible material. The at least one third adaptor may be secured to the printed circuit board by at least one of adhesives, mechanical fasteners, and soldering. The first and second adaptors may be one of pins, pegs, and rivets for insertion into respective holes formed in the printed circuit board. The at least one third adaptor may be one of a pin, peg, and rivet for insertion into at least one respective hole formed in the printed circuit board. The first and second adaptors may be washers attached to the printed circuit board by mechanical means. And, the at least one third adaptor may be a washer attached to the printed circuit board by mechanical means.

BRIEF DESCRIPTION OF THE DRAWINGS

Further features and advantages of the embodiments of the present invention will become apparent from the following detailed description, taken in combination with the appended drawings, in which.

It will be noted that throughout the appended drawings, like features are identified by like reference numerals.

DETAILED DESCRIPTION OF THE EMBODIMENTS

In the following description, details are set forth to provide an understanding of the invention. In some instances, certain circuits, structures and techniques have not been described or shown in detail in order not to obscure the invention.

In electronic equipment that has PCBs or PCB cards installed in card guides, the thickness of the edges of the PCB or PCB card that run in the guides must be specified such that the PCB or PCB card fits into the U-shaped channels of the card guides without excessive play and is thus aligned correctly with the connectors and guide pins of the backplane or midplane of the card cage. Typically, once the card guide's channel width is defined, the required thickness of the PCB or PCB card is established. It is common practice to accommodate a thicker-than-nominal PCB in card guides by milling the edges of the PCB to reduce their thickness. This may be the case, for example, if the layer count of a PCB exceeds that for which the system was designed. The opposite case, where a thinner-than-nominal PCB is required, is what the present invention is directed toward. In this case, where a thin PCB must fit into card guides designed for thick PCBs, the present invention provides means to increase the thickness of the edges of the PCB (i.e., the surface of the PCB near its edges), or portions of that edge, where it interacts with the channels of the card guides (and/or faceplate), in such a way that proper alignment is achieved between the PCB and the connectors, guide pins, and other mechanical features of the backplane of the card cage.

Figure 1:
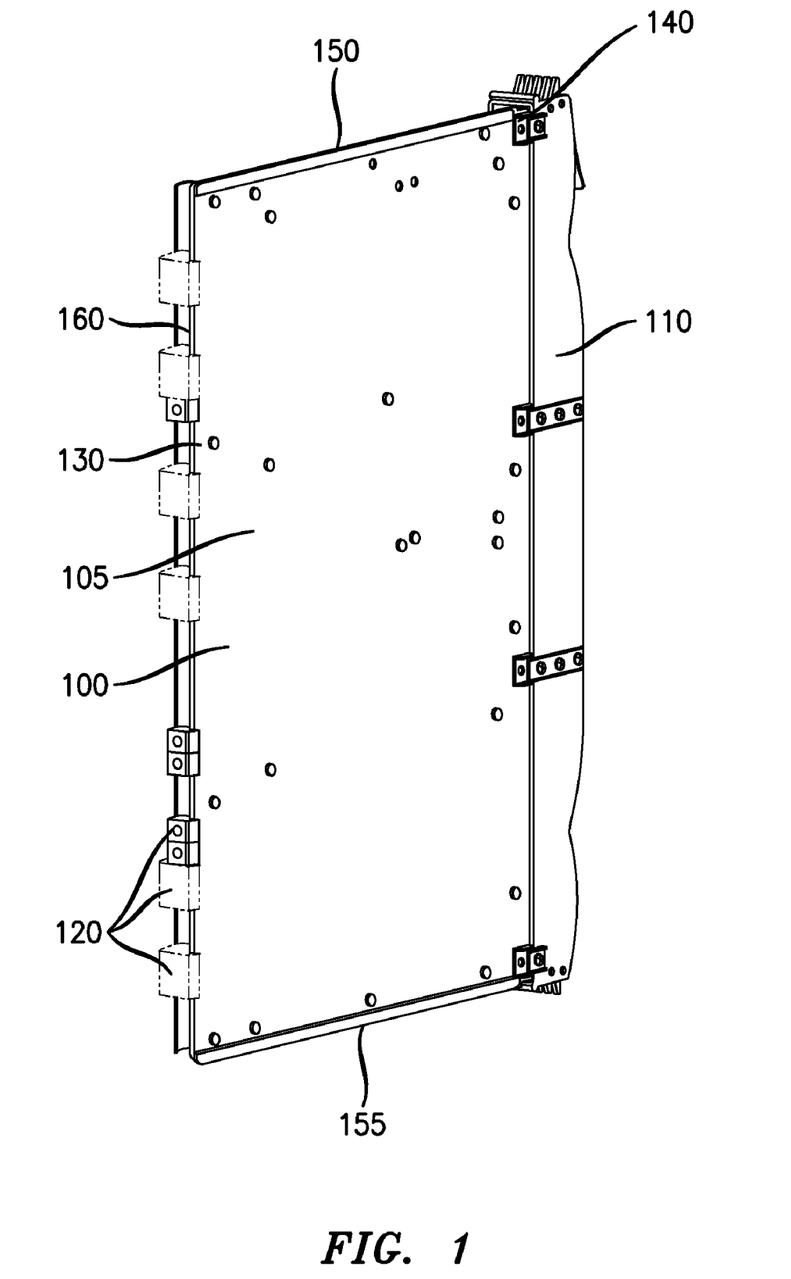
FIG. 1 is a perspective view illustrating a printed circuit board ("PCB") card having a printed circuit board ("PCB") and one or more thickness adaptors for aligning the PCB within the channels of card guides and faceplates in accordance with an embodiment of the invention; and, FIG. 2 is an exploded perspective view of the printed circuit board of FIG. 1 in accordance with an embodiment of the invention.
Figure 2:
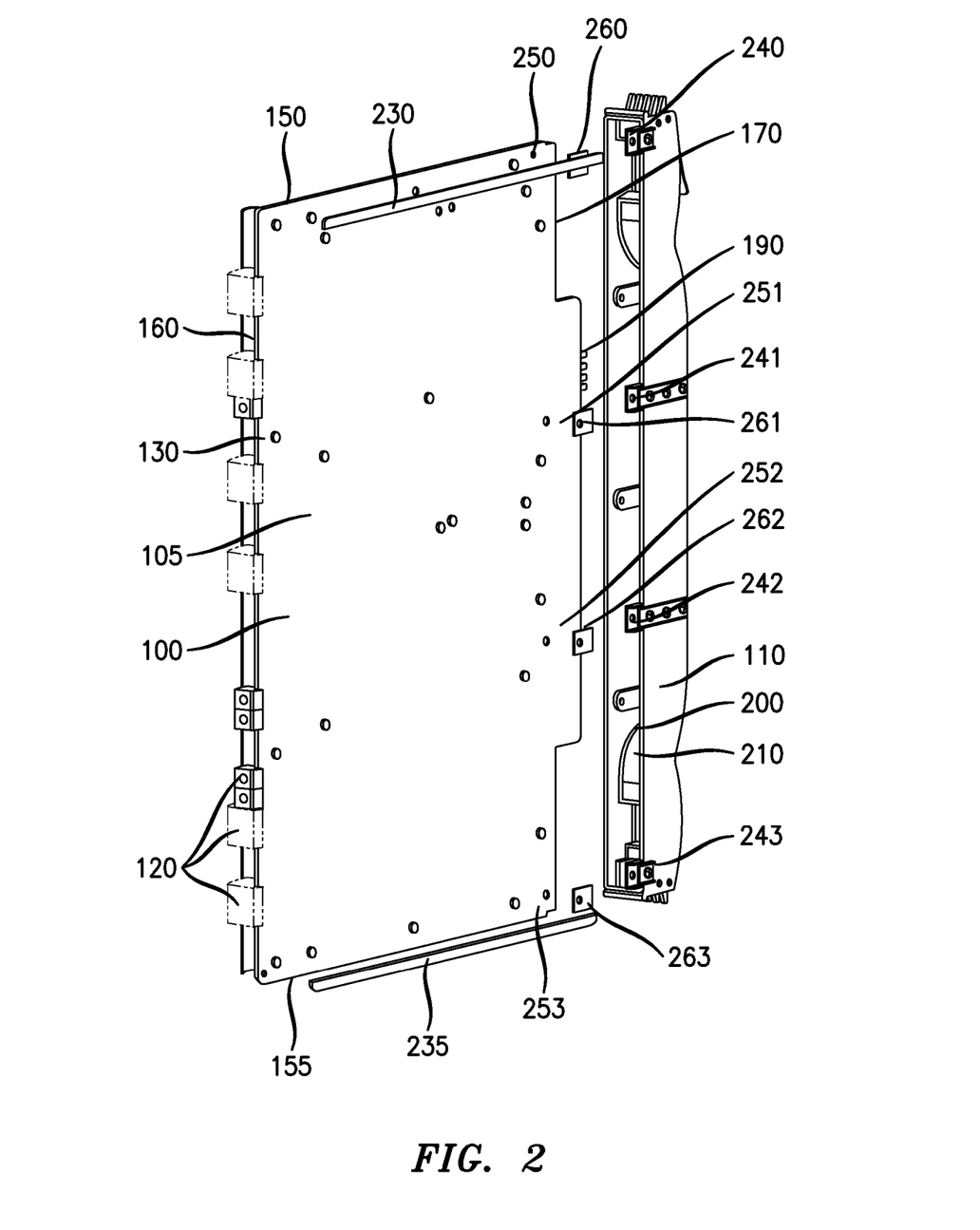

FIG. 1 is a perspective view illustrating a printed circuit board ("PCB") card 100 having a printed circuit board ("PCB") 105 and one or more thickness adaptors for aligning the PCB 105 within the channels of card guides (not shown) and faceplates 110 in accordance with an embodiment of the invention. And, FIG. 2 is an exploded perspective view of the PCB card 100 of FIG. 1 in accordance with an embodiment of the invention.

The card guides (not shown) and faceplate 110 may belong to a system configured to accept thick PCBs (not shown) while the PCB card 100 has a thin PCB 105 for installation in the system. As such, the PCB card 100 includes one or more thickness adaptors 230, 235, 260, 261, 262, 263 (as will be described in more detail below) fixed to the PCB 105 allowing it to mate with both the card guides and faceplate 110 of the system. The PCB card 100 and faceplate 110 may form part of a telecommunications or other system (not shown).

The PCB 105 of the PCB card 100 has mounted thereon various electronic components for performing a desired function and/or for providing indications to a user (e.g., light emitting diodes 190 along the front edge 170 of the PCB 105 for viewing through windows or openings (not shown) in the faceplate 110). Electronic components may be mounted on both sides of the PCB 105 and may be connected by conductors passing through vias 130 in the PCB 105.

Along its rear edge 160, the PCB 105 has one or more connectors 120 for mating with corresponding connectors (not shown) on the backplane (not shown) of the card cage (not shown). The one or more connectors 120 may be separate modular connectors, separate contacts, or they may form a single connector. The rear edge 160 of the PCB 105 is thus inserted into the backplane via the card guides. The top and bottom edges 150, 155 of the PCB 105 are received by the card guides which align the PCB 105 and its connectors 120 with the backplane and its mating connectors. The card guides may include appropriately spaced and opposing U-shaped channels (or slots or rails) (not shown) for receiving the top and bottom edges 150, 155 of the PCB 105.

The faceplate 110 may have an outer facing surface (not shown) equipped with handles or tabs 140 for grasping by a user to insert or remove the faceplate 110 and PCB card 100 from the card cage. These handles or tabs 140 may also be used to secure or lock the PCB card 100 into the card guides and/or card cage. A rear inner facing surface 200 of the faceplate 110 may have a U-shaped channel or slot 210 formed thereon or therein for receiving the front edge 170 of the PCB 105. The U-shaped channel or slot 210 may be formed by or include one or more contact points or tabs 240, 241, 242, 243 distributed along the rear surface 200 of the faceplate 110. The contact points or tabs 240, 241, 242, 243 of the faceplate 110 are for contacting corresponding points 250, 251, 252, 253 along the front edge 170 of one or both sides of the PCB 105 for the purpose of attaching the faceplate 110 to the PCB 105. In one embodiment, the PCB 105 plugs or snaps into a slot 210 formed on the rear surface 200 of the faceplate 110. Of course, the PCB 105 may be attached to the faceplate 110 in a number of different ways depending on the design of the faceplate 110.

Now, the channels of the card guides and the slot 210 of the faceplate 110 are sized to accept "thick" PCBs. For example, a thick PCB may have a thickness of approximately 0.110 inches. On the other hand, the PCB card 100 has a "thin" PCB 105 which may have a thickness of approximately 0.090 inches.

According to one embodiment, in order for the thin PCB 105 to fit securely in the channels of the card guides, the PCB card 100 is provided with first and second strips of polycarbonate material 230, 235 which are applied at the top and bottom edges 150, 155 of the PCB 105 (e.g., to the surface of the PCB 105 near its edges 150, 155), respectively, to increase the thickness of the PCB card 100 along those edges. The thickness of this material 230, 235 is approximately equal to the difference (e.g., 0.020 inches) between the thicknesses of the thick PCB and the thin PCB 105. These strips of material 230, 235 may be referred to as alignment adaptors, edge thickeners, or thickness adaptors. The adaptors 230, 235 may be applied to one or both sides of the PCB 105 along the board's top and bottom edges 150, 155, as required. These adaptors 230, 235 allow a thin PCB 105 to be accurately aligned with an existing card cage's backplane through the card cage's existing card guides. As such, the existing system's card guides need not be modified to accommodate thin PCBs 105.

According to one embodiment, (optional) adaptors 260, 261, 262, 263 may also be provided along the front edge 170 (on one or both sides) of the PCB 105 to increase the thickness of the PCB card 100 along that edge thus allowing for the proper alignment of the existing faceplate 110 with its slot in the card cage. This allows the faceplate 110 to be used with a thin PCB 105. The front edge adaptors 260, 261, 262, 263 are located over the points of contact 250, 251, 252, 253 on the PCB 105 of the contact points 240, 241, 242, 243 of the faceplate 110 (i.e., where the channel 210 of the faceplate 110 attaches to the PCB 105). The result of the application of the thickness adaptors 230, 235, 260, 261, 262, 263 to the PCB 105 is an assembly 100, 110 that is backwards-compatible with the existing card cage. According to one embodiment, the front edge adaptor is a single strip of material (applied to one or both sides of the PCB 105) similar to the top and bottom edge adaptors 230, 235.

Note that for existing 0.110 inch thick PCBs, vias typically have a diameter of approximately 0.013 inches. Thus, the via aspect ratio is typically a comfortable 8 to 8.5. In new generation thin PCBs, vias may have a diameter of the approximately 0.010 inches. For a 0.110 inch thick PCB with 0.010 inch in diameter vias, the via aspect ratio would be about 11. However, by using the adaptors 230, 235, 260, 261, 262, 263 of the present invention, the PCB thickness may be reduced to, say, 0.090 inches which would reduce the via aspect ratio to approximately 9 for 0.010 inch in diameter vias. These thicknesses are, of course, exemplary. PCBs may range from one layer of routing (copper) to over thirty layers and may have thicknesses ranging from tens of mils (i.e., thousandths of an inch) to hundreds of mils. In fact, flexible PCBs used in space-critical applications (e.g., wrist watches) may have thicknesses of only a few mils.

For reference, the problem with high aspect ratio vias is that they have a higher tendency to crack (typically in the middle) creating an open circuit. This open circuit is often intermittent and hence difficult to reliably detect. The reason for the higher tendency to crack is twofold. First, a via is created by drilling a hole through the PCB and then plating it with a conductive material (e.g., copper). The higher the aspect ratio, the harder it is to get adequate plating right through the PCB resulting in thinner plating near the middle of the via's length. Second, a thicker PCB (i.e., longer vias) is subject to greater thermal expansion and contraction. When this effect is combined with a small diameter via the resulting strain is more likely to lead to cracking.

According to one embodiment, the thickness adaptors 230, 235, 260, 261, 262, 263 may be formed from shimming stock attached to the PCB 105 by means of adhesive strips or liquid adhesives. Shimming stock or "shim stock" is shimming material that is readily available and used for shimming or spacing applications. It is typically made from brass, steel, or stainless steel and has a thickness that is controlled to a high level of precision. Shim stock is typically available in thickness from 0.5 mil to 30 mil in 1 mil increments.

According to another embodiment, the thickness adaptors 230, 235, 260, 261, 262, 263 may be blocks or spacers (i.e., other than shim stock) that are mechanically fastened to the edges of the PCB 105. These blocks or spacers may be made from a fiber reinforced material such as FR-4 (i.e., flame retardant woven glass reinforced epoxy resin similar to the material that a typical PCB is made from), a flame retardant plastic, or a metal (i.e., ferrous or non-ferrous). These blocks or spacers may be built-up or machined-down to the required thickness.

According to another embodiment, the thickness adaptors 230, 235, 260, 261, 262, 263 may be shim stock, blocks, or spacers that are fastened to the edges of the PCB 105 by a soldering process.

According to another embodiment, the thickness adaptors 230, 235, 260, 261, 262, 263 may be leaf-springs (or other compressible materials) that are mounted to the PCB 105 and which allow for automatic adjustment to the legacy card guide channel width.

According to another embodiment, the thickness adaptors 230, 235, 260, 261, 262, 263 may be spacers pressed into the PCB 105 (i.e., by mechanical interference or by interference fit). For example, the spacers may be pins or pegs pressed into holes of the same size or slightly smaller formed near the edges of the PCB 105. The spacers may have small protrusions (such as pegs or pins or daggers) and may be installed in the PCB 105 by pressing these protrusions into appropriately sized holes in the PCB 105. As another example, the spacers may be rivets each having a shank length that does not protrude through the PCB 105 and a head of appropriate thickness to provide the required spacing function. One or a number of these rivets may be used along the edge of the PCB 105. In the case where only one rivet is used for each of the top and bottom edges, or in the case where the spacer is not elongate, the preferred location would be closest to the rear edge 160 of the PCB 105. In such a case, the rivets would function to align the connectors of the PCB 105 with the backplane and the faceplate 110 may be provided with tapered side walls to align itself by ramping off the side walls of adjacent faceplates. As another example, referring to FIG. 3, the spacers may be washers such as, for example, the depicted washer spacers 302 and 304 which are attached to the PCB 105 by mechanical means such as screws, rivets, etc. (not shown in FIG. 3)

The present invention provides several advantages as follows. It allows for PCBs of various thicknesses to be adapted for use with card cages having card guides with fixed width channels. The invention is applicable to electronic systems, in general, beyond applications in the telecommunications field. The invention is a cost-effective solution to the problem of installing thinner PCBs in existing equipment. The PCB cards 100 of the present invention are inexpensive to manufacture and easy to install in existing systems. And, the present invention reduces the need for costly in-field modifications to existing card cage systems.

In summary, according to one aspect of the invention, there is provided a printed circuit board card 100 comprising: a printed circuit board 105 having a first thickness (e.g., 0.090 inches) and having first (e.g., top) and second (e.g., bottom) edges 150, 155 for inserting into respective channels of card guides, the channels of the card guides for receiving printed circuit boards having a second thickness (e.g., 0.110 inches), the second thickness being greater than the first thickness;

and, first and second thickness adaptors 230, 235 each having a third thickness (e.g., 0.020 inches) applied at the first and second edges 150, 155, respectively, a sum of the first and third thicknesses approximating the second thickness, to thereby align the printed circuit board 105 in the channels of the card guides.

Figure 3:
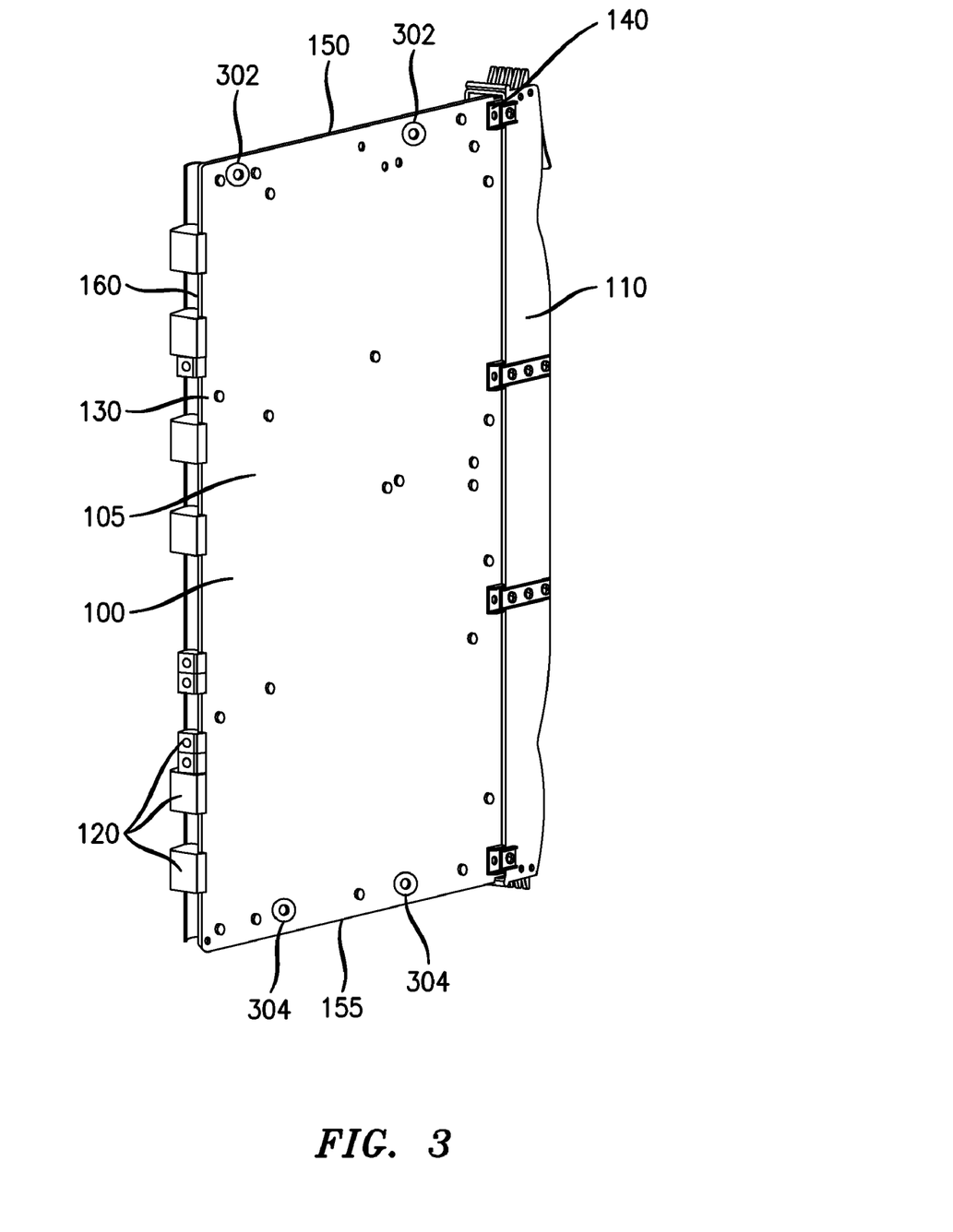
FIG. 3 is a perspective view of a PCB card havng a PCB and one or more washer type thickness adapters for aligning the PCB within the channels of card guides and faceplates in accordance with an embodiment of the invention.
Figure 4:
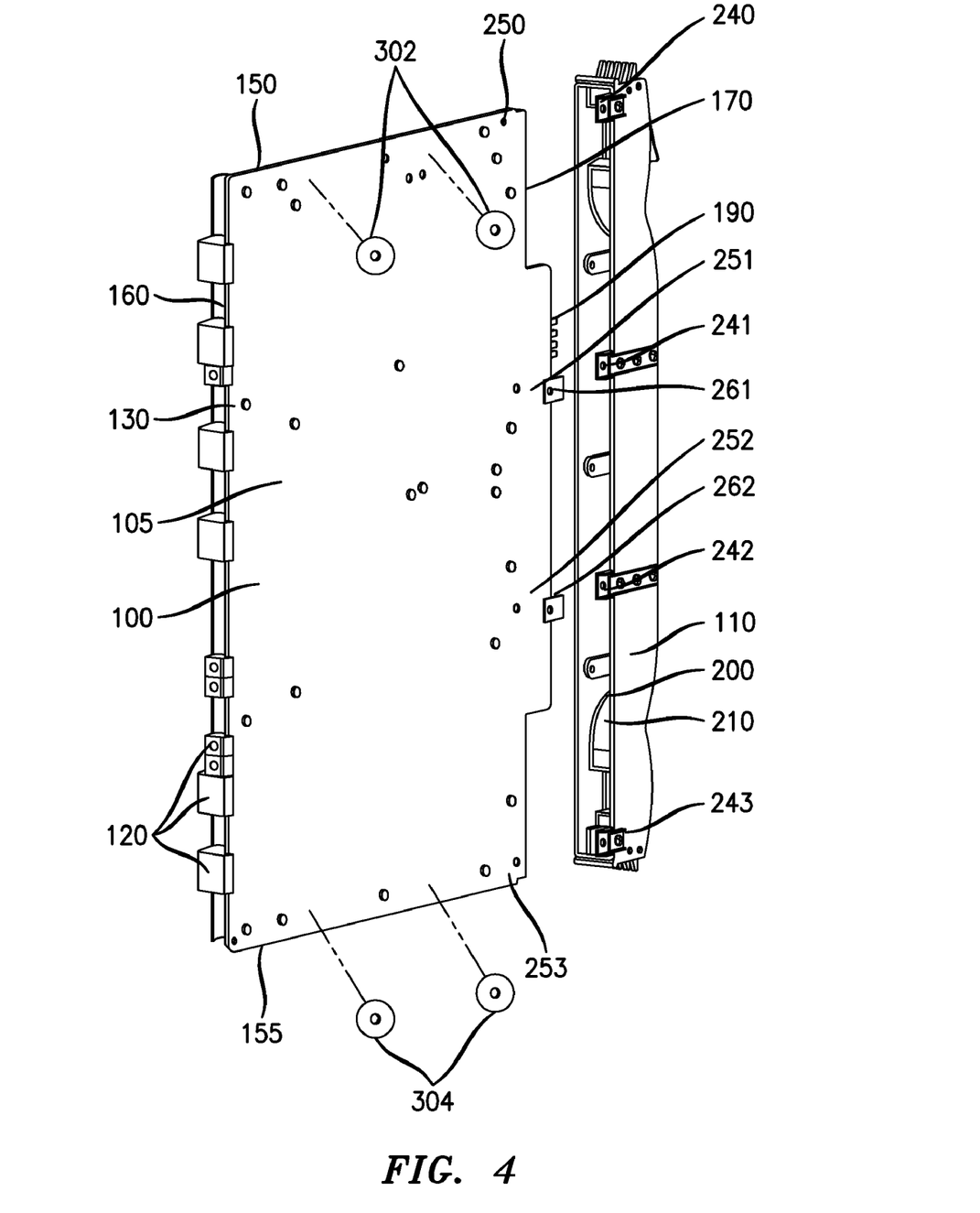
FIG. 4 is an exploded perspective view of the printed circuit board of FIG. 3 in accordance with an embodiment the invention.

With respect to the above printed circuit board card 100, the card guides may be components of a card cage. The printed circuit board 105 may have a third (e.g., rear) edge 160 for inserting into a backplane of the card cage. The printed circuit board 105 may have a fourth (e.g., front) edge for inserting into a channel 210 on a rear surface 200 of a faceplate 110, the channel for receiving printed circuit boards having the second thickness, and may further include at least one third thickness adaptor 260, 261, 262, 263 having the third thickness applied at the fourth edge to thereby align the printed circuit board 105 in the channel 210 of the faceplate 110. The faceplate 110 may have means 140 for securing the printed circuit board 105 in at least one of the card guides and the card cage. The first and second adaptors 230, 235 may be formed from one of a shimming stock, a woven glass reinforced epoxy resin, a plastic, a metal, a leaf-spring, and a compressible material. The first and second adaptors 230, 235 may be elongate strips. The first and second adaptors 230, 235 may be secured to the printed circuit board 105 by at least one of adhesives, mechanical fasteners, and soldering. The at least one third adaptor 260, 261, 262, 263 may be formed from one of a shimming stock, a woven glass reinforced epoxy resin, a plastic, a metal, a leaf-spring, and a compressible material. The at least one third adaptor 260, 261, 262, 263 may be secured to the printed circuit board 105 by at least one of adhesives, mechanical fasteners, and soldering. The first and second adaptors 230, 235 may be one of pins, pegs, and rivets for insertion into respective holes formed in the printed circuit board 105. The at least one third adaptor 260, 261, 262, 263 may be one of a pin, peg, and rivet for insertion into at least one respective hole formed in the printed circuit board 105. The first and second adaptors 230, 235 may be washers attached to the printed circuit board 105 by mechanical means. FIG. 3, depicts example washer adaptors, labeled 302 and 304, attached to the PCB 105 by mechanical means (not shown in FIG. 3), and shown in exploded view in FIG. 4. And, the at least one third adaptor 260, 261, 262, 263 may be a washer attached to the printed circuit board 105 by mechanical means.

The embodiments of the invention described above are intended to be exemplary only. Those skilled in this art will understand that various modifications of detail may be made to these embodiments, all of which come within the scope of the invention.

What is claimed is:

1. A printed circuit board card apparatus comprising:
a printed circuit board having first and second edges, each of the first and second edges having a given card thickness;
a first alignment adaptor member fixedly secured to the printed circuit board at the first edge, the first alignment adaptor member having an adaptor thickness; and
a second alignment adaptor member fixedly secured to the printed circuit board at the second edge, the second alignment adaptor member having said adaptor thickness;
a card support including a card guide having a first channel supporting the first edge of the printed circuit card and the first alignment adaptor member, and having a second channel supporting the second edge of the printed circuit card and the second alignment adaptor member,
wherein the first channel and the second channel have a given channel thickness, and
wherein a sum of the card thickness and the adaptor thickness is approximately equal the given channel thickness, to provide alignment of the printed circuit board in the first and second channels of the card guide while being inserted into said channels,
wherein the card support includes a faceplate having a rear surface having a faceplate channel having the given channel thickness and the printed circuit board has a fourth edge for inserting into the faceplate channel, and further comprising at least one third alignment adaptor member having the third thickness, said member fixedly secured to the printed circuit board at the fourth edge to align the printed circuit board in the channel of the faceplate.

2. The printed circuit board card apparatus of claim 1 wherein the card support includes a card cage supporting the card guide.

3. The printed circuit board card apparatus of claim 2 wherein the card cage includes a backplane and the printed circuit board has a third edge for inserting into the backplane. board in the channel of the faceplate.

4. The printed circuit board card apparatus of claim 1 wherein the faceplate has means for securing the printed circuit board in at least one of the card guide and the card cage.

5. The printed circuit board card apparatus of claim 1 wherein the first and second alignment adaptors members are formed from a compressible material.

6. The printed circuit board card apparatus of claim 5 wherein the first and second alignment adaptors members are fixedly secured to the printed circuit board by adhesives.

7. The printed circuit board card apparatus of claim 1 wherein the first alignment adaptor member is a single elongate strip of a thickness approximately equal to the adaptor thickness, and the alignment second adaptors member is a single elongate strips of thickness approximately equal to the adaptor thickness.

8. The printed circuit board card apparatus of claim 1 wherein the at least one third alignment adaptor member is formed from a metal shimming stock.

9. The printed circuit board card apparatus of claim 8 wherein the at least one third alignment adaptor member is secured to the printed circuit board by soldering.

10. The printed circuit board card apparatus of claim 1, wherein the printed circuit board includes holes formed at the first edge and at the second edge, and wherein the first and second alignment adaptor members are one of pins, pegs, and rivets having a portion inserted into respective ones of the holes formed in the printed circuit board and a portion extending the adapter thickness above the printed circuit board to contact a surface of the respective first and second channel.

11. The printed circuit board card apparatus of claim 1, wherein the printed circuit board includes at least one hole formed at the third edge, and wherein the at least one third alignment adaptor member is one of a pin, peg, and rivet having a portion inserted into at least one respective one of the holes formed at the third edge of the printed circuit board and having a portion extending the adapter thickness above the printed circuit board to contact a surface of the respective third channel.

12. The printed circuit board card apparatus of claim 1 wherein the at least one third alignment adaptor member is a washer, having the thickness equal to the adaptor thickness, fixedly secured to the printed circuit board by mechanical means.

13. The printed circuit board card of claim 1 wherein the first and second alignment adaptor members are formed of metal, and are fixedly secured to the printed circuit board by soldering.

14. A printed circuit board card apparatus comprising:
- a printed circuit board having first and second edges, each of the first and second edges having a given card thickness;
- a first alignment adaptor member fixedly secured to the printed circuit board at the first edge, the first alignment adaptor member having an adaptor thickness; and
- a second alignment adaptor member fixedly secured to the printed circuit board at the second edge, the second alignment adaptor member having said adaptor thickness;
- a card support including a card guide having a first channel supporting the first edge of the printed circuit card and the first alignment adaptor member, and having a second channel supporting the second edge of the printed circuit card and the second alignment adaptor member,
- wherein the first channel and the second channel have a given channel thickness, and
- wherein a sum of the card thickness and the adaptor thickness is approximately equal the given channel thickness, to provide alignment of the printed circuit board in the first and second channels of the card guides while being inserted into said channels,
- wherein the first and second alignment adaptors member are washers, having a thickness equal to the adaptor thickness, fixedly secured to the printed circuit board by mechanical means.

15. A method for providing aligned insertion of a printed circuit board card of a given card thickness into a card guide having card support channels of a channel thickness greater than the given card thickness, comprising:
- identifying a plurality of different thickness kinds of alignment adapter members;
- providing, for each of the different thickness kinds, a plurality of alignment adapter members having an adaptor thickness according to the corresponding thickness kind;
- identifying a thickness difference between the channel thickness and the card thickness;
- selecting the thickness kind of alignment adaptor member based on the identified thickness;
- fixedly securing at least one alignment adapter member of the selected kind at a first edge of the printed circuit card to obtain an overall thickness at the first edge approximately equal to the channel thickness;
- fixedly securing at least one alignment adapter member of the selected kind at a second edge of the printed circuit card to obtain an overall thickness the second edge approximately equal to the channel thickness; and
- inserting the printed card into the card support channels by inserting the first edge with the fixedly secured at least one alignment adapter member into one of the channels, concurrent with inserting the second edge with the fixedly secured at least one alignment adapter member into another of the channels,
- wherein the providing, for each of the different thickness kinds, a plurality of alignment adapter members provides alignment adapter members each formed of a single elongate strip member having an adaptor thickness according to the corresponding thickness kind.

16. The method of claim 15, wherein the providing, for each of the different thickness kinds, a plurality of alignment adapter members provides alignment adapter members formed of a single elongate metal strip member,
- wherein the fixedly securing at least one alignment adapter member of the selected kind at a first edge of the printed circuit card includes soldering the at least one alignment adapter member to the printed circuit board, and
- wherein the fixedly securing at least one alignment adapter member of the selected kind at a second edge of the printed circuit card includes soldering the at least one alignment adapter member to the printed circuit board.

* * * * *

UNITED STATES PATENT AND TRADEMARK OFFICE
CERTIFICATE OF CORRECTION

PATENT NO. : 7,663,888 B2
APPLICATION NO. : 11/487506
DATED : February 16, 2010
INVENTOR(S) : Simon Paul Creasy, Paul James Brown and Fabien Letourneau It is certified that error appears in the above-identified patent and that said Letters Patent is hereby corrected as shown below:

Col. 8, Claim 3, delete line 4.

Col. 8, Claim 6, line 2, change "adaptors" to --adaptor--.

Col. 8, Claim 7, line 4, change "adaptors" to --adaptor--; line 5, change "strips" to --strip--.

Col. 9, Claim 14, line 22, change "guides" to --guide--; line 24, change "adaptors" to --adaptor--.

Signed and Sealed this

Fourth Day of May, 2010

David J. Kappos
*Director of the United States Patent and Trademark Office*

UNITED STATES PATENT AND TRADEMARK OFFICE
CERTIFICATE OF CORRECTION

PATENT NO.        : 7,663,888 B2                                    Page 1 of 1
APPLICATION NO.  : 11/487506
DATED             : February 16, 2010
INVENTOR(S)       : Creasy et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 462 days.

Signed and Sealed this

Fourth Day of January, 2011

David J. Kappos
*Director of the United States Patent and Trademark Office*